(12) United States Patent
Cai et al.

(10) Patent No.: US 8,593,848 B2
(45) Date of Patent: Nov. 26, 2013

(54) PROGRAMMING METHOD FOR PROGRAMMING FLASH MEMORY ARRAY STRUCTURE

(75) Inventors: Yimao Cai, Beijing (CN); Ru Huang, Beijing (CN); Poren Tang, Beijing (CN); Shiqiang Qin, Beijing (CN)

(73) Assignee: Peking University, Beijing (CN)

(*) Notice: Subject to any disclaimer, the term of this patent is extended or adjusted under 35 U.S.C. 154(b) by 202 days.

(21) Appl. No.: 13/146,005

(22) PCT Filed: Apr. 21, 2011

(86) PCT No.: PCT/CN2011/072400
§ 371 (c)(1),
(2), (4) Date: Jul. 22, 2011

(87) PCT Pub. No.: WO2012/129816
PCT Pub. Date: Oct. 4, 2012

(65) Prior Publication Data
US 2012/0243313 A1 Sep. 27, 2012

(30) Foreign Application Priority Data
Mar. 25, 2011 (CN) .......................... 2011 1 0074350

(51) Int. Cl.
*G11C 5/06* (2006.01)
(52) U.S. Cl.
USPC ...... 365/63; 365/51; 365/185.16; 365/185.17
(58) Field of Classification Search
USPC ...... 365/63 O, 51 X, 185.16 X, 185.17 X, 63, 365/51, 185.16, 185.17
See application file for complete search history.

(56) References Cited

U.S. PATENT DOCUMENTS

| | | | |
|---|---|---|---|
| 6,239,500 B1 | 5/2001 | Sugimachi | |
| 6,274,453 B1* | 8/2001 | Schlosser et al. | 438/386 |
| 6,535,427 B1* | 3/2003 | Takano et al. | 365/185.21 |

(Continued)

FOREIGN PATENT DOCUMENTS

| | | |
|---|---|---|
| CN | 1252623 | 5/2000 |
| CN | 1262525 A | 8/2000 |

(Continued)

OTHER PUBLICATIONS

International Search Report for PCT/CN2011/072400 dated Apr. 21, 2011 (11 pages in length).

*Primary Examiner* — Vanthu Nguyen
(74) *Attorney, Agent, or Firm* — Bozicevic, Field & Francis LLP; Bret E. Field

(57) ABSTRACT

The invention provides a flash memory array structure and a method for programming the same, which relates to a technical field of nonvolatile memories in ultra large scale integrated circuit fabrication technology. The flash memory array of the present invention includes memory cells, word lines and bit lines connected to the memory cells, wherein the word lines connected to control gates of the memory cells and the bit lines connected to drain terminals of the memory cells are not perpendicular to each other but cross each other at an angle; the control gates of two memory cells adjacent to each other along the channel direction between every two bit lines are controlled by two word lines, respectively, drain terminals thereof are controlled by two bit lines, respectively, and source terminals thereof are shared. The present invention also provides a method for programming the flash memory array structure, which can realize a programming with low power consumption.

5 Claims, 3 Drawing Sheets

(56) References Cited

U.S. PATENT DOCUMENTS

| | | | |
|---|---|---|---|
| 7,529,114 B2 * | 5/2009 | Asao | ................................ 365/63 |
| 7,608,504 B2 | 10/2009 | Liu et al. | |
| 2007/0285960 A1 | 12/2007 | Lung et al. | |

FOREIGN PATENT DOCUMENTS

| | | |
|---|---|---|
| CN | 101079438 A | 11/2007 |
| CN | 101136411 | 3/2008 |
| JP | 8288471 | 11/1996 |

* cited by examiner

PROGRAMMING METHOD FOR PROGRAMMING FLASH MEMORY ARRAY STRUCTURE

FIELD OF THE INVENTION

The invention relates to the technical field of nonvolatile memory in the ultra large scale integrated circuit fabrication technology, and particularly, relates to a nonvolatile memory array and a method for programming the same.

BACKGROUND OF THE INVENTION

Nonvolatile memories, represented by flash memory, are widely used in various products, such as storage or communication devices such as mobile phone, laptop, palmtop and solid-state hard disk, and the like, due to their advantages such as data-holding capability even though power supply is cut off, as well as the capability of erasing and writing data for multiple times, etc. Presently, flash memories have occupied most of the market share of nonvolatile semiconductor memories, wherein NOR flash memories are widely used in code storage chips of mobile terminals such as mobile phones and the like, due to their high speed for random access. However, the conventional NOR flash memory adopts channel hot electron injection method, which has two significant limitations: firstly, the efficiency of the channel hot electron programming is very low and thus the power consumption is very high; secondly, a relatively high bit line voltage (usually, 4-5V) is needed in such a programming method, therefore, in order to prevent a punch-through phenomenon from occurring under such a high bit line voltage, the channel length of the memory cell in the conventional NOR flash memory array cannot be reduced rapidly, thus the decrease of the memory cells in size and the increase of the storage density of the NOR flash memory are limited. Due to the two limitations, it is difficult for the NOR flash memories to meet the requirements for large capacity, low cost, low power consumption nonvolatile memory technology.

For the disadvantage that the power consumption is high in the channel hot electron programming of the NOR flash memories, a split-gate programming method is used to reduce power consumption in references [1], [2] and [3]. In such a technology, different voltages are applied to the gates, that is, a relatively low voltage is applied to the gate close to the source terminal and a high voltage is applied to the gate close to the drain terminal, thus the efficiency for programming can be improved so as to reduce the power consumption. However, all of the existing split-gate technologies are designed with respect to one cell, making the process to be complex. Particularly, a relatively large difference of the programming voltages between the source terminal and the drain terminal is necessary in such a memory cell, thus limiting the shortening of the channel of the flash memory cell.

For the challenge that the shortening of the cell channel is limited due to the high bit line voltage required for the channel hot electron programming of the NOR flash memories, a method that two adjacent cells on the same word line are both involved in the programming is used in the references [4] and [5], in which such a bit line voltage for programming is shared by two adjacent cells and therefore a source/drain punch-through problem in a single device can be effectively avoided. However, such a technology is based on the conventional NOR-type array (as shown in FIG. 1) or NROM array, in which word lines and bit lines are perpendicular to each other and thus the two adjacent cells both involved in the programming share one word line that controls the voltages of control gates, making it impossible for the split-gate programming method to be used in these arrays and thereby there exists a problem that the power consumption for programming is limited.

In a word, that how to improve the capability of reducing the size of the flash memory and decrease the power consumption is an urgent problem to be solved in the flash memory technology.

REFERENCES

[1] S. Kianian, A. Levi, D. Lee, and Y.-W. Hu, "A novel 3 volts-only, small sector erase, high density Flash EEPROM," in Symp. VLSI Tech. Dig., 1994, pp. 71-72.;

[2] B. Yeh, "Single transistor non-volatile electrically alterable semiconductor memory device," U.S. Pat. No. 5,029,130, July 1991.;

[3] Ma, Y.; Pang, C. S.; Pathak, J.; Tsao, S. C.; Chang, C. F.; Yamauchi, Y.; Yoshimi, M.; "A novel high density contactless flash memory array using split-gate sources-side-injection cell for 5 V-only applications" Symposium on VLSI Technology, 1994. Page(s): 49-50.;

[4] Wen-Jer Tsai, Ou T. F., Huang J. S., Cheng C. H., Chun-Yuan Lu, Wang T., Chen K. F., Han T. T., Lu T. C., Chen K. C., Chih-Yuan Lu, "A highly punch through-immune operation method for an ultra-short-channel hot-carrier-injection type non-volatile memory cell" Electron Devices Meeting, IEEE International 2008. Page(s): 1-4;

[5] Tahui Wang, Chun-Jung Tang, Li, C.-W., Chih Hsiung Lee, Ou, T. -F., Yao-Wen Chang, Wen-Jer Tsai, Tao-Cheng Lu, Chen, K.-C., Chih-Yuan Lu, "A Novel Hot-Electron Programming Method in a Buried Diffusion Bit-Line SONOS Memory by Utilizing Nonequilibrium Charge Transport" Electron Device Letters, IEEE Volume: 30, Issue: 2 2009, Page(s): 165-167.

SUMMARY OF THE INVENTION

The present invention provides a flash memory array structure and a method for programming the same, which can improve the capability of reducing the size of the flash memory while decreasing the power consumption.

A flash memory array structure comprises: a plurality of memory cells; word lines connected to control gates of the memory cells; bit lines connected to drain terminals of the memory cells, wherein the bit lines and the word lines cross each other at an angle ranging from 0° to 180° excluding 90°, that is, the bit lines and the word lines are not perpendicular to each other. Every two memory cells adjacent to each other along the channel direction share a source terminal, each of the word lines in a row direction is connected to the control gates of all the memory cells in the same row of the array, and each of the bit lines is connected to the drain terminals of all the memory cells in the same column. In the array, the control gates of two memory cells adjacent to each other along the channel direction between every two bit lines are controlled by two adjacent word lines, respectively, drain terminals thereof are controlled by two bit lines, respectively, and source terminals thereof are shared.

There is no special requirement on the flash memory cells in the above mentioned array, the flash memory cells may be floating-gate-type flash memory cells, or may also be trapping-type flash memory cells. Moreover, there is also no special requirement on the material of the word lines and the bit lines, the word lines and the bit lines may be metal conductive lines, or may also be metal compounds or semiconductor conductive lines.

A programming method for a flash memory is provided, in which a hot electron injection mechanism is used. In the above mentioned array, when programming a selected cell, the selected cell is programmed together with a memory cell adjacent to and having a common source with the selected cell along a channel direction, and the two memory cells are connected in series. A bias voltage (3-5V) is applied to the bit line of the selected memory cell and a bias voltage (7-10V) is applied to the word line of the selected memory cell, whereas the bit line of the adjacent memory cell along the channel direction is grounded and a bias voltage (3-7V) is applied to the word line of the adjacent memory cell, and the source terminal that is shared by the two series-connected memory cells is floating, thereby realizing a programming with a low power consumption. In the programming method, the electrons are accelerated in the channels of the adjacent cells, and then attracted by a vertical electric field produced by the word line voltage bias in the channel of the selected memory cells, so as to be injected into a charge storage layer.

In the array structure according to the present invention, the bit lines connected to the drain terminals of the memory cells and the word lines connected to the control gates of the memory cells are not perpendicular to each other but cross each other at an angle. The control gates of two memory cells adjacent to each other along the channel direction between every two bit lines are controlled by two word lines, respectively, the drain terminals of the two memory cells are controlled by two bit lines, respectively, and source terminals of the two memory cells are shared. The method for programming a flash memory array structure provided in the present invention can reduce power consumption. In the programming method, when a selected cell is programmed, the selected cell and a memory cell adjacent to and having a common source with the selected cell along the channel direction is programmed together, wherein a bias voltage (3-5V) is applied to the bit line of the selected memory cell and a bias voltage (7-10V) is applied to the word line of the selected memory cell, whereas the bit line of the memory cell connected in series with the selected cell is grounded and a bias voltage (3-7V) is applied to the word line thereof, and the source terminal that is shared by the two series-connected memory cells is floating, thereby realizing a programming with low power consumption.

As compared with the prior art, the flash memory array structure and the method for programming the same provided in the present invention have advantages in that, the control gates of two memory cells adjacent to each other along the channel direction between every two bit lines are connected with two word lines, respectively. Therefore, the programming method provided in the present invention may be adopted by the array, that is, the two adjacent memory cells are connected in series and involved together in the programming, so that the high voltage for the bit lines needed by the programming is allocated to the two memory cells, thereby the punch-through effect can be effectively avoided and thus the capability of reducing the size of the memory cell is improved and the storage density is increased. Meanwhile, in the array according to the present invention, two memory cells adjacent to each other along the channel direction are controlled by two word lines, respectively, so that different voltages are applied to the two word lines, therefore, a split-gate programming can be implemented in the array and the power consumption for programming can be effectively reduced.

Hence, the above flash memory array and the method for programming the same can improve the capability of reducing the size of the flash memory while decreasing the power consumption.

BRIEF DESCRIPTION OF THE DRAWINGS

FIG. 2 is a schematic view showing a flash memory array of the present invention, in which:

'01' denotes bit lines, '02' denotes word lines, '03' denotes contact holes at drain terminals, and '04' denotes two memory cells adjacent to each other along the channel direction between two bit lines.

Figure 3:
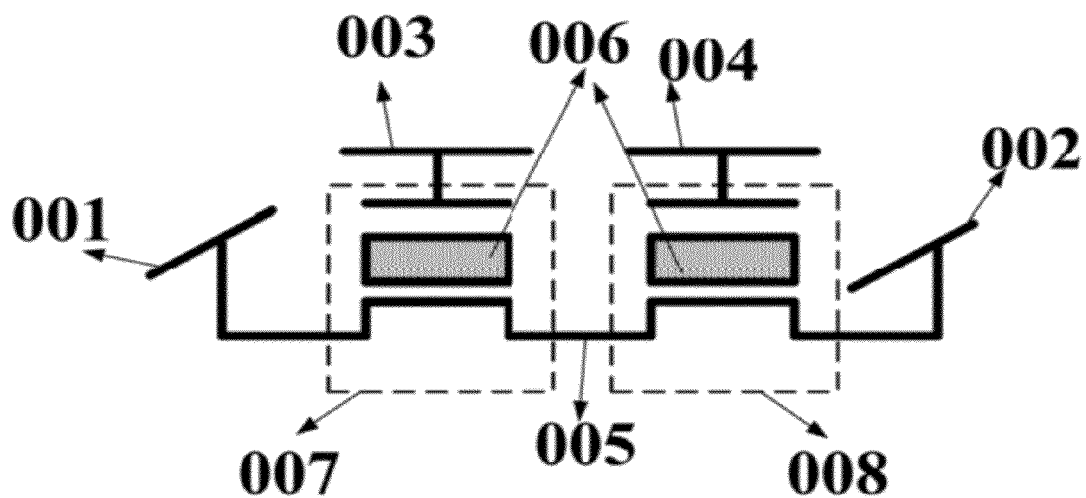

FIG. 3 is a schematic view showing two memory cells adjacent to each other along the channel direction between two bit lines in the array according to the present invention, in which:

'001' denotes bit line N, '002' denotes bit line N+1, '003' denotes word line N, '004' denotes word line N+1, '005' denotes common source terminal, '006' denotes cell charge storage layers, '007' denotes memory cell N, and '008' denotes memory cell N+1.

DETAILED DESCRIPTION OF THE EMBODIMENTS

Hereinafter, the present invention will be further described with reference to three embodiments; however, the purposes of the present invention are not limited to the following specific embodiments.

Figure 1:
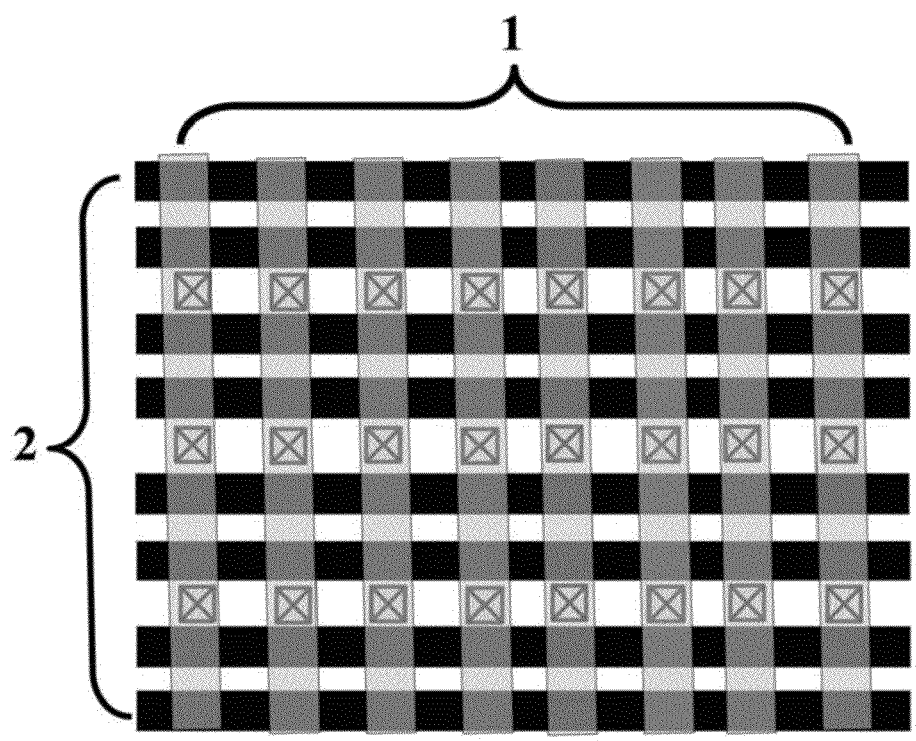
FIG. 1 is a schematic view showing a flash memory array in prior art, in which: '1' denotes bit lines, and '2' denotes word lines.
Figure 2:
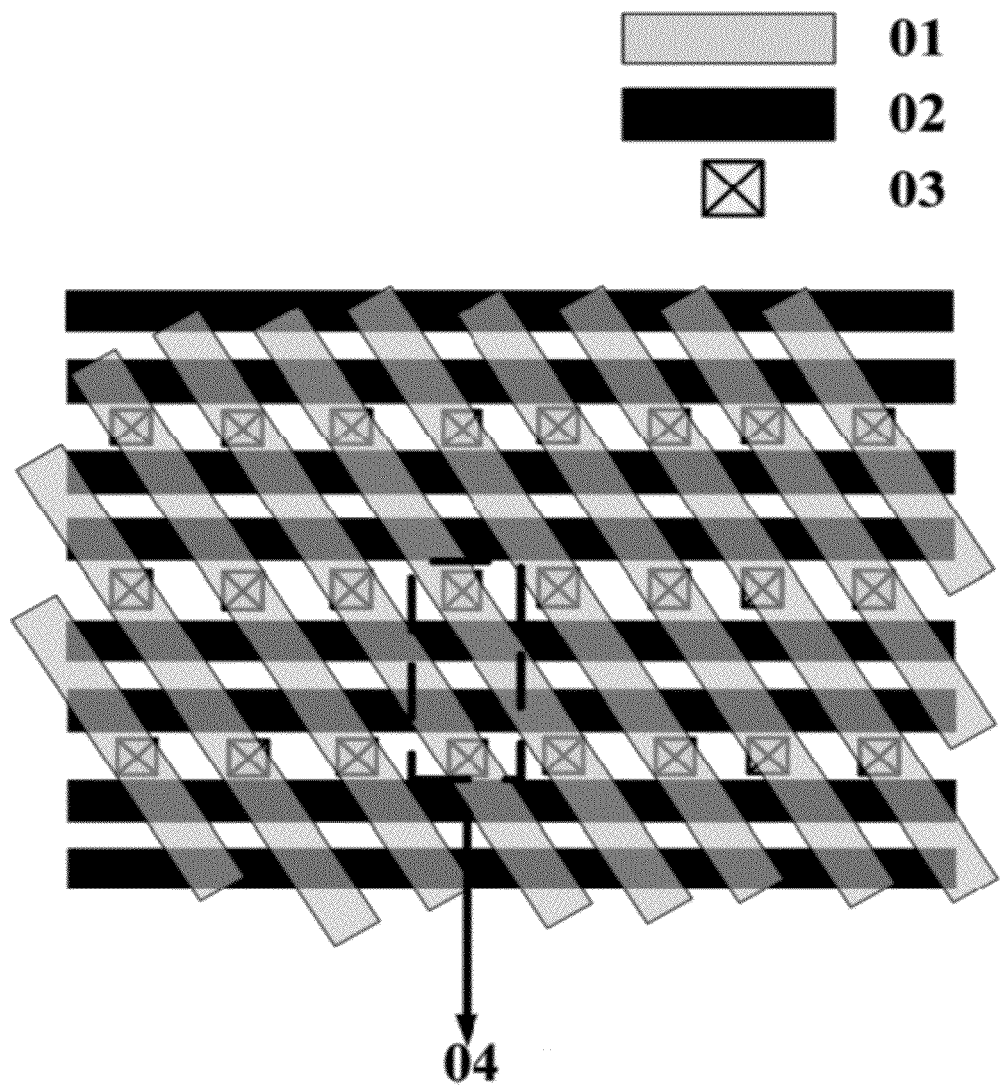

As shown in FIG. 2, a flash, memory array provided by the present invention includes 01—bit lines, 02—word lines, 03—contact holes at drain terminals, and 04—two memory cells adjacent to each other along the channel direction between two bit lines. As shown in FIG. 3, the memory cells between two bit lines include 001—bit line N, 002—bit line N+1, 003—word line N, 004—word line N+1, 005—common source terminal, 006—cell charge storage layers, 007—memory cell N, and 008—memory cell N+1. The array is characterized in that control gates of all the memory cells in the same row of the array are connected to the word lines in the row direction. The bit lines in the column direction are crossed with the word lines at an angle, to which drain terminals of all the memory cells in the same column are connected. In the array, the control gates of two memory cells adjacent to each other along the channel direction between every two bit lines are controlled by two adjacent word lines, respectively, drain terminals thereof are controlled by two bit lines, respectively, and source terminals thereof are shared.

A new programming method is proposed on the basis of the above described flash memory array, the method comprises: performing programming by involving both of two memory cells adjacent to each other along a channel direction between two adjacent bit lines and connected in series, wherein one bit line is grounded and the other bit line is connected to a high bit line programming voltage, a common source terminal is floating, therefore the high bit line voltage needed for programming is allocated to the two memory cells, and thus the punch-through effect can be effectively avoided. Meanwhile, the control gates of the two memory cells are connected to two word lines, respectively, and different voltages are applied to the two word lines when programming, thus a split-gate programming can be implemented in the array, and the power consumption in programming can be effectively reduced.

Hereinafter, a preferred embodiment of the programming method provided by the present invention will be described in detail with reference to FIG. 3. It is assumed that the (N+1)th memory cell (008) is to be programmed.

(1) the bit line N (001) of the memory cell (007) that is adjacent to the (N+1)th memory cell (008) is grounded, and a voltage of 3-7V is applied to the word line N (003) thereof;

(2) a voltage of 3-5V is applied to the bit line N+1 of the memory cell (008) selected to be programmed, and a voltage of 7-10V is applied to the word line N+1 (004) thereof;

(3) the common source terminal (005) of the two adjacent memory cells N and N+1 is floating.

Finally, it should be noted that, the object of disclosing the embodiments is to facilitate further understanding of the present invention; however, the person skilled in the art can understand that various substitutions and modifications are possible without departing from the spirit and scope of the appended claims and the present invention. Therefore, the present invention is not limited to the contents disclosed by the embodiments, and the scope to be protected by the present invention is the scope defined by the appended claims.

What is claimed is:

1. A programming method for programming a flash memory array structure comprising:
a plurality of memory cells constituting an array, wherein word lines and bit lines cross each other but are not perpendicular to each other; each of the word lines is connected to control gates of all the memory cells in a same row of the array; each of the bit lines is connected to drain terminals of all the memory cells in a same column; and every two memory cells adjacent to each other along a channel direction share a source terminal,
the programming method characterized in that: a programming is performed by involving both of two memory cells adjacent to each other along a channel direction between two adjacent bit lines and connected in series, wherein one bit line is grounded and a high bit line programming voltage is applied to the other bit line, and the common source terminal is floating, while the control gates of the two memory cells are connected to two word lines, respectively, and different voltages are applied to the two word lines when the programming is performed.

2. The programming method according to claim 1, characterized in that, a voltage of 3-5V is applied to the bit line of the selected memory cell, a voltage of 7-10V is applied to the word line of the selected memory cell, and the source terminal of the selected memory cell is floating.

3. The programming method according to claim 2, characterized in that, the bit line of the memory cell adjacent to and connected in series with the selected memory cell is grounded, and a voltage of 3-7V is applied to the word line thereof.

4. The programming method according to claim 1, characterized in that, the control gates of two memory cells adjacent to each other along the channel direction between two bit lines are controlled by two adjacent word lines, respectively, drain terminals thereof are controlled by two bit lines, respectively, and source terminals thereof are shared.

5. The programming method according to claim 1, characterized in that, the memory cells are floating-gate-type flash memory cells or trapping-type flash memory cells.

* * * * *